US012667023B2

(12) United States Patent
Lee et al.

(10) Patent No.: US 12,667,023 B2
(45) Date of Patent: Jun. 23, 2026

(54) PACKAGE DEVICE INCLUDING CAPACITOR DISPOSED ON OPPOSITE SIDE OF DIE RELATIVE TO SUBSTRATE

(71) Applicant: Samsung Electronics Co., Ltd., Suwon-si (KR)

(72) Inventors: Sangho Lee, Suwon-si (KR); Kihyun Kim, Suwon-si (KR); Sangyong Park, Suwon-si (KR); Kwanghyun Baek, Suwon-si (KR); Seungjae Baek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 286 days.

(21) Appl. No.: 18/467,062

(22) Filed: Sep. 14, 2023

(65) Prior Publication Data

US 2024/0006391 A1      Jan. 4, 2024

Related U.S. Application Data

(63) Continuation of application No. PCT/KR2022/002136, filed on Feb. 14, 2022.

(30) Foreign Application Priority Data

Apr. 9, 2021     (KR) ........................ 10-2021-0046616

(51) Int. Cl.
*H10W 90/00*          (2026.01)
*H05K 1/181*          (2026.01)
*H10W 70/68*          (2026.01)

(52) U.S. Cl.
CPC ............ *H10W 90/00* (2026.01); *H05K 1/181* (2013.01); *H10W 70/68* (2026.01); (Continued)

(58) Field of Classification Search
CPC ... H01L 25/16; H01L 23/49833; H01L 23/13; H01L 23/49816; H01L 23/642; (Continued)

(56) References Cited

U.S. PATENT DOCUMENTS 6,894,396 B2     5/2005  Shioga et al.
7,329,950 B2     2/2008  Khorram
(Continued)

FOREIGN PATENT DOCUMENTS

JP          2018-195774 A      12/2018
KR          10-0878708 B1       1/2009
(Continued)

OTHER PUBLICATIONS

International Search Report dated May 23, 2022, issued in International Patent Application No. PCT/KR2022/002136.
(Continued)

*Primary Examiner* — Alonzo Chambliss
(74) *Attorney, Agent, or Firm* — Jefferson IP Law, LLP

(57)          ABSTRACT

A package device is provided. The package device includes a substrate, a plurality of upper lands disposed on one surface of the substrate, a plurality of upper solder balls disposed on the plurality of upper lands, a die connected to the plurality of upper solder balls, a plurality of lower lands disposed on the other surface of the substrate, a plurality of lower solder balls disposed on some of the plurality of lower lands, and a capacitor connected to the lower lands on which the plurality of lower solder balls are not disposed among the plurality of lower lands, provided on an opposite side of the die, and including a height greater than the height of the plurality of lower solder balls.

15 Claims, 13 Drawing Sheets

(52) U.S. Cl.
 CPC ....... *H10W 90/401* (2026.01); *H10W 90/701*
  (2026.01); *H05K 2201/10015* (2013.01); *H05K*
  *2201/10098* (2013.01); *H05K 2201/10378*
  (2013.01); *H05K 2201/10515* (2013.01); *H05K*
  *2201/10704* (2013.01); *H05K 2201/10734*
  (2013.01); *H05K 2201/10962* (2013.01);
  *H10W 90/724* (2026.01)

(58) Field of Classification Search
 CPC ............ H01L 23/485; H01L 23/49811; H01L
  23/528; H01L 24/17; H01L 24/16; H01L
  2224/16227; H05K 1/181; H05K
  2201/10378; H05K 2201/10515; H05K
  2201/10724; H10W 90/00; H10W 90/701;
  H10W 90/401; H10W 90/68; H10W
  90/764
 See application file for complete search history.

(56) References Cited

U.S. PATENT DOCUMENTS

| | | | | |
|---|---|---|---|---|
| 7,378,733 | B1 * | 5/2008 | Hoang .................. | H01L 23/642 |
| | | | | 257/E23.178 |
| 8,264,846 | B2 | 9/2012 | Jones et al. | |
| 9,659,127 | B2 | 5/2017 | Jung et al. | |
| 10,396,047 | B2 * | 8/2019 | Ong .................. | H01L 23/49827 |
| 11,289,412 | B2 * | 3/2022 | Williamson ............ | H01L 23/50 |
| 2005/0218502 | A1 * | 10/2005 | Sunohara ................ | H01L 23/50 |
| | | | | 257/E23.079 |
| 2007/0289127 | A1 * | 12/2007 | Hurwitz .............. | H05K 3/4682 |
| | | | | 257/E23.005 |
| 2017/0012029 | A1 | 1/2017 | Lambert et al. | |
| 2017/0040266 | A1 * | 2/2017 | Lin ..................... | H01L 23/5389 |
| 2017/0287853 | A1 * | 10/2017 | Kim ................... | H01L 23/5386 |
| 2019/0139853 | A1 * | 5/2019 | Oh .................... | H01L 23/49822 |
| 2019/0164893 | A1 * | 5/2019 | Kim ................... | H01L 23/5389 |
| 2019/0311978 | A1 | 10/2019 | Cheah et al. | |
| 2021/0091017 | A1 * | 3/2021 | Yeon .................... | H01L 23/552 |

FOREIGN PATENT DOCUMENTS

| | | | |
|---|---|---|---|
| KR | 10-2010-0107408 | A | 10/2010 |
| KR | 10-2011-0139983 | A | 12/2011 |
| KR | 10-2013-0023383 | A | 3/2013 |
| KR | 10-2013-0033808 | A | 4/2013 |
| WO | 03/058717 | A2 | 7/2003 |

OTHER PUBLICATIONS

Extended European Search Report dated Aug. 13, 2024, issued in
European Patent Application No. 22784761.3.

* cited by examiner

PACKAGE DEVICE INCLUDING CAPACITOR DISPOSED ON OPPOSITE SIDE OF DIE RELATIVE TO SUBSTRATE

CROSS-REFERENCE TO RELATED APPLICATION(S)

This application is a continuation application, claiming priority under § 365(c), of an International application No. PCT/KR2022/002136, filed on Feb. 14, 2022, which is based on and claims the benefit of a Korean patent application number 10-2021-0046616, filed on Apr. 9, 2021, in the Korean Intellectual Property Office, the disclosure of which is incorporated by reference herein in its entirety.

BACKGROUND

1. Field

The disclosure relates to a package device including a capacitor disposed on an opposite side of a die relative to a substrate.

2. Description of Related Art

To achieve a high data rate, it is considered that a fifth generation (5G) communication system is implemented in an ultra high frequency (millimeter wave (mmWave)) band (e.g., a 60 gigahertz (GHz) band). To reduce propagation loss of a radio wave and increase a transmission range, in the 5G communication system, beamforming, huge multiple-input multiple-output (MIMO), full dimensional MIMO (FD-MIMO), an array antenna, analog beam forming, and large scale antenna techniques have been discussed. In addition, to improve a network of the 5G communication system, techniques, such as an advanced small cell, a cloud radio access network (RAN), an ultra-dense network, device-to-device (D2D) communication, wireless backhaul, a moving network, cooperative communication, coordinated multi-point (CoMP), and reception-end interference cancellation, have been developed. In the 5G communication system, hybrid frequency shift keying and quadrature amplitude modulation (FQAM) and sliding window superposition coding (SWSC), which are advanced coding modulation (ACM), and filter bank multi carrier (FBMC), non-orthogonal multiple access (NOMA), and sparse code multiple access (SCMA), which are advanced access techniques, have been developed.

As the appearance of a wireless edge that distributes intelligence to a device, a digital unit (DU) of long-term evolution (LTE) is divided into a DU (or a distributed unit) and a centralized unit (CU) in 5G. Since the DU of 5G directly processes data with a small volume of information by a wireless edge system, low latency is a characteristic of 5G unlike LTE.

In addition, in LTE, an antenna, a radio frequency (RF) cable, a remote radio head (RRH) or a radio unit (RU) are independently configured. However, due to the development of technology, in 5G, those are integrated as one and changed to an active antenna unit (AAU). Furthermore, a digital antenna unit (DAU) integrating the AAU and the DU may be launched when moving from non-stand alone (NSA) in which LTE equipment and 5G equipment are linked to stand-alone (SA), which is a 5G single mode.

In a 5G broadband transceiver using a capacitor of the related art, because a gap may be required between components, for example, a die and a capacitor, it may be difficult to dispose the capacitor near the die. When a distance between a power bump of the die and the capacitor is great, the performance of the capacitor may be degraded. In addition, when two or more types of power exist, because different layers may need to be used when two or more types of power go to the same type, the number of layers may increase. Thus, the total thickness of a package may increase.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a package device for improving the performance of a capacitor by efficiently connecting a power bump of a die to the capacitor.

Additional aspects will be set forth in part in the description which follows and, in part, will be apparent from the description, or may be learned by practice of the presented embodiments.

In accordance with an aspect of the disclosure, a package device including a capacitor disposed on an opposite side of a die relative to a substrate (hereinafter, referred to as a "package device") is provided. The package device includes a substrate, a plurality of upper lands disposed on one surface of the substrate, a plurality of upper solder balls disposed on the plurality of upper lands, a die connected to the plurality of upper solder balls, a plurality of lower lands disposed on the other surface of the substrate, a plurality of lower solder balls disposed on some of the plurality of lower lands, and a capacitor connected to the lower lands on which the plurality of lower solder balls are not disposed among the plurality of lower lands, provided on an opposite side of the die, and including a height greater than the height of the plurality of lower solder balls.

In accordance with another aspect of the disclosure, a package device is provided. The package device includes a motherboard, at least one antenna connected to the motherboard, a substrate including a bottom surface facing the motherboard and a top surface that is an opposite surface of the bottom surface, a plurality of upper lands disposed on the top surface of the substrate, a plurality of upper solder balls disposed on the plurality of upper lands, a die connected to the plurality of upper solder balls, a plurality of lower lands disposed on the bottom surface of the substrate, a plurality of lower solder balls disposed on some of the plurality of lower lands, and a capacitor connected to the lower lands on which the plurality of lower solder balls are not disposed among the plurality of lower lands, provided on an opposite side of the die, and including a height greater than the height of the plurality of lower solder balls, and wherein the capacitor is disposed at a position overlapping the die based on a height direction of the substrate.

In accordance with another aspect of the disclosure, a package device is provided. The package device includes a motherboard, at least one antenna connected to the motherboard, a substrate including a bottom surface facing the motherboard and a top surface that is an opposite surface of the bottom surface, a plurality of upper solder balls disposed on the top surface of the substrate, a die connected to the plurality of upper solder balls, a plurality of lower solder balls disposed on the bottom surface of the substrate, and a capacitor connected to the substrate and disposed at a position overlapping the die based on a height direction of the substrate.

According to an embodiment of the disclosure, a package device may improve the performance of a capacitor by efficiently connecting a power bump of a die to the capacitor.

According to an embodiment of the disclosure, when a height of the capacitor is greater than a height of a solder ball, the package device may position the capacitor near the power bump of the die while preventing interference of the capacitor with a motherboard.

According to an embodiment of the disclosure, a height of a printed circuit board (PCB) may decrease by decreasing the number of layers of the PCB of the package device.

According to an embodiment of the disclosure, the package device may decrease power impedance in an ultra-high frequency (mmWave) band. In addition, in the package device, the number of layers constituting a substrate may be decreased by converting a power plane in a plane direction into the vertical direction.

According to an embodiment of the disclosure, because the package device allows to dispose a land for power and a land for ground on a substrate near the central portion rather than the edge portion, the size of the substrate may decrease.

According to an embodiment of the disclosure, the package device may allow easy underfill or molding processing as the number of components provided on a surface where a die is provided decreases.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
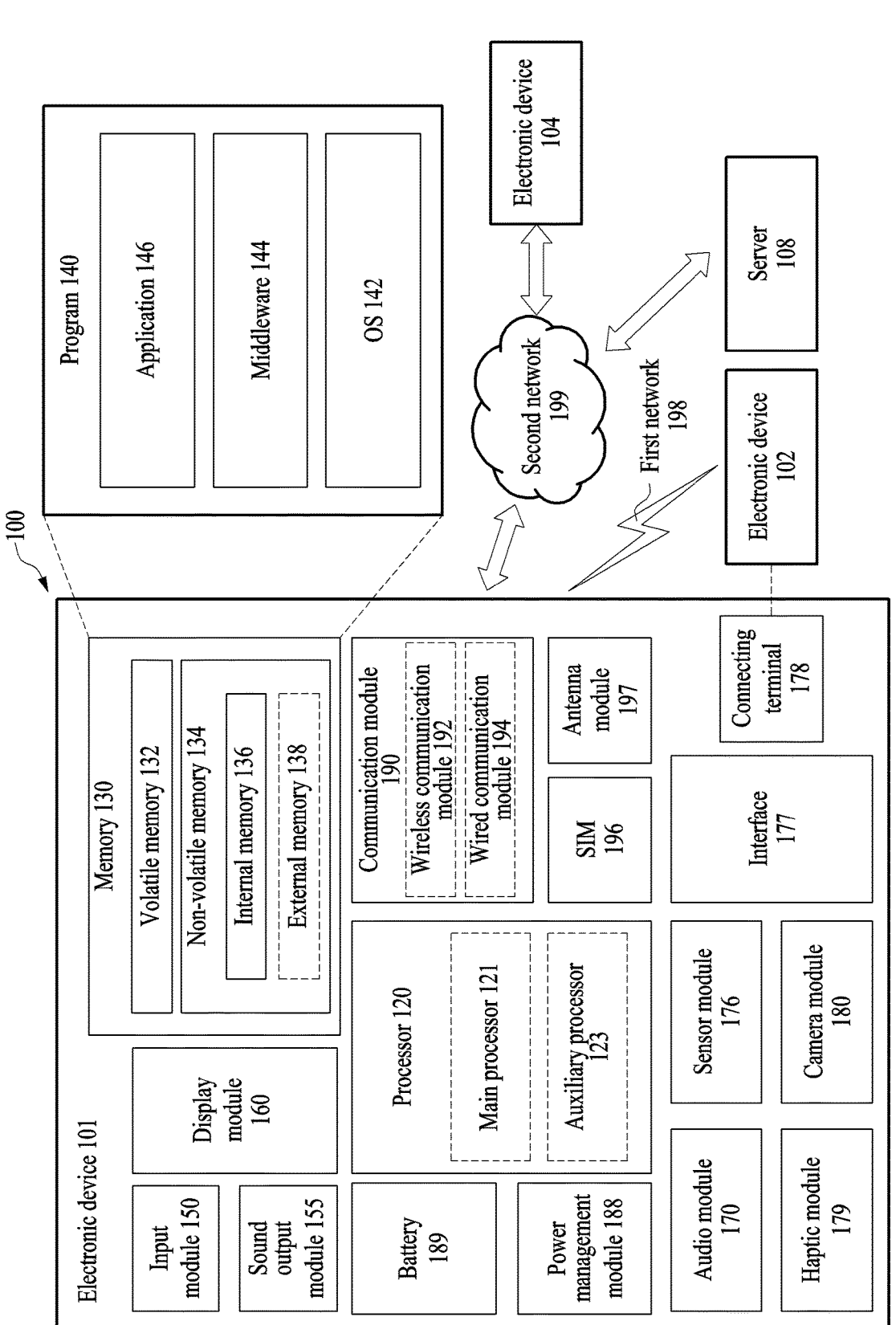
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or communicate with at least one of an external electronic device 104 or a server 108 via a second network 199 (e.g., a long-range wireless communication network). According to one embodiment of the disclosure, the electronic device 101 may communicate with the external electronic device 104 via the server 108. According to one embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one (e.g., the connecting terminal 178) of the above components may be omitted from the electronic device 101, or one or more other components may be added in the electronic device 101. In some embodiments of the disclosure, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one embodiment of the disclosure, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one embodiment of the disclosure, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., a sleep) state or along with the main processor 121 while the main processor 121 is in an active state (e.g., executing an application). According to one embodiment of the disclosure, the auxiliary processor 123 (e.g., an ISP or a CP) may be implemented as a portion of another component (e.g., the camera module 180 or the communication module 190) that is functionally related to the auxiliary processor 123. According to one embodiment of the disclosure, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to one embodiment of the disclosure, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to one embodiment of the disclosure, the display module 160 may include a touch sensor adapted to detect a touch, or a pressure sensor adapted to measure an intensity of a force incurred by the touch.

The audio module 170 may convert a sound into an electric signal or vice versa. According to one embodiment of the disclosure, the audio module 170 may obtain the sound via the input module 150 or output the sound via the sound output module 155 or an external electronic device (e.g., the external electronic device 102, such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to one embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the external electronic device 101 to be coupled with the external electronic device (e.g., the electronic device 102) directly (e.g., by wire) or wirelessly. According to one embodiment of the disclosure, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the external electronic device 102). According to one embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to one embodiment of the disclosure, the haptic module 179 may include, for example, a motor, a piezoelectric element, or an electric stimulator.

The camera module 180 may capture a still image and moving images. According to one embodiment of the disclosure, the camera module 180 may include one or more lenses, image sensors, ISPs, or flashes.

The power management module 188 may manage power supplied to the electronic device 101. According to one embodiment of the disclosure, the power management module 188 may be implemented as, for example, at least a part of a power management integrated circuit (PMIC).

The battery 189 may supply power to at least one component of the electronic device 101. According to one embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the external electronic device 104), or a network system (e.g., the second network 199). According to one embodiment of the disclosure, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. According to one embodiment of the disclosure, the antenna module 197 may include an antenna including a radiating element including a conductive material or a conductive pattern formed in or on a substrate (e.g., a printed circuit board (PCB)). According to one embodiment of the disclosure, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to one embodiment of the disclosure, another component (e.g., a radio frequency integrated circuit (RFIC)) other than the radiating element may be additionally formed as a part of the antenna module 197.

According to one embodiment of the disclosure, the antenna module 197 may form a mmWave antenna module. According to an example embodiment of the disclosure, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment of the disclosure, commands or data may be transmitted or received between the electronic device 101 and the external electronic device 104 via the server 108 coupled with the second network 199. Each of the external electronic devices 102 or 104 may be a device of the same type as or a different type from the electronic device 101. According to one embodiment of the disclosure, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or mobile edge computing. In one embodiment of the disclosure, the external electronic device 104 may include an Internet-of-things (IoT) device. The server 108 may be an intelligent server using machine learning and/or a neural network. According to an example embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to embodiments may be one of various types of electronic devices. The electronic device may include, for example, a portable communication device (e.g., a smartphone), a computer device, a portable multimedia device, a portable medical device, a camera, a wearable device, or a home appliance device. According to one embodiment of the disclosure, the electronic device is not limited to those described above.

It should be appreciated that various example embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, "A or B," "at least one of A and B," "at least one of A or B," "A, B or C," "at least one of A, B and C," and "at least one of A, B, or C," each of which may include any one of the items listed together in the corresponding one of the phrases, or all possible combinations thereof. Terms, such as "1st," "2nd," or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to one embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to one embodiment of the disclosure, a method according to various example embodiments of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to embodiments of the disclosure, each component (e.g., a module or a program) of the above-described components may include a single entity or multiple entities, and some of the multiple entities may be separately disposed in different components. According to embodiments of the disclosure, one or more of the above-described components may be omitted, or one or more other components may be added. Alternatively or additionally, a plurality of components (e.g., modules or programs) may be integrated into a single component. In such a case, according to embodiments of the disclosure, the integrated component may still perform one or more functions of each of the plurality of components in the same or similar manner as they are performed by a corresponding one of the plurality of components before the integration. According to embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2A:
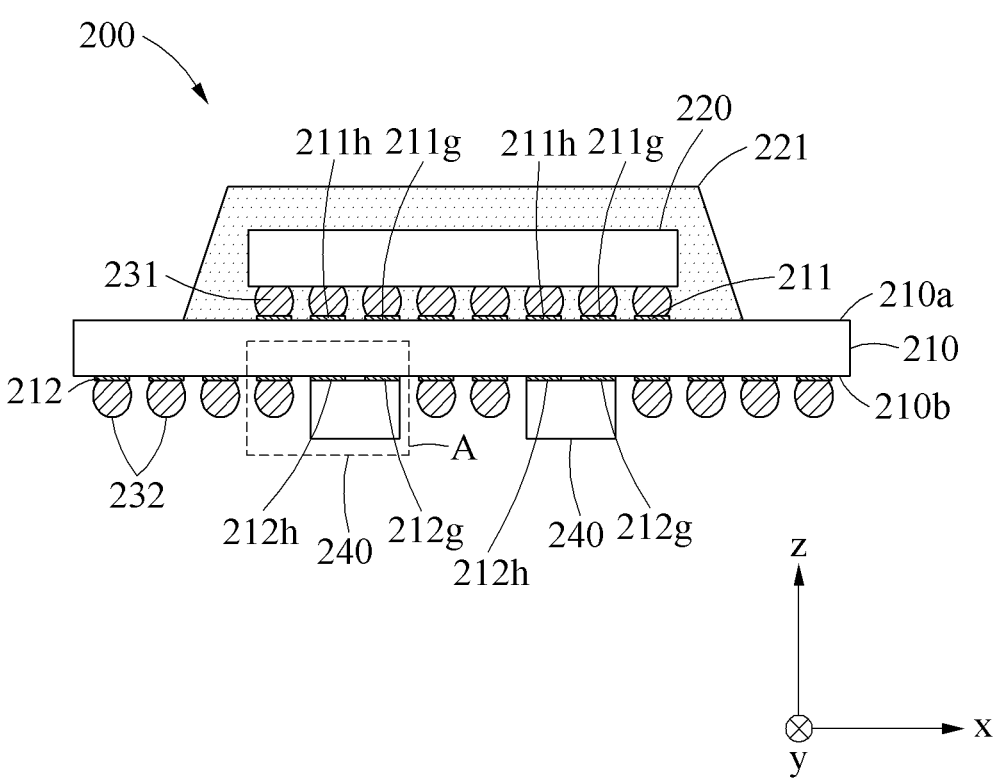
FIG. 2A is a cross-sectional view of a package device according to an embodiment of the disclosure.
Figure 2B:
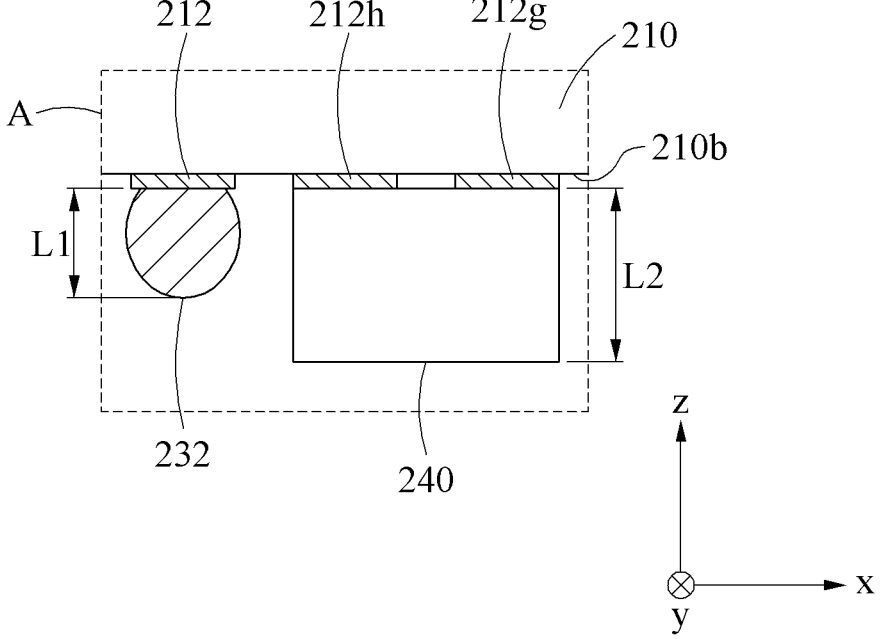
FIG. 2B is an enlarged view of A of FIG. 2A according to an embodiment of the disclosure.
Figure 2C:
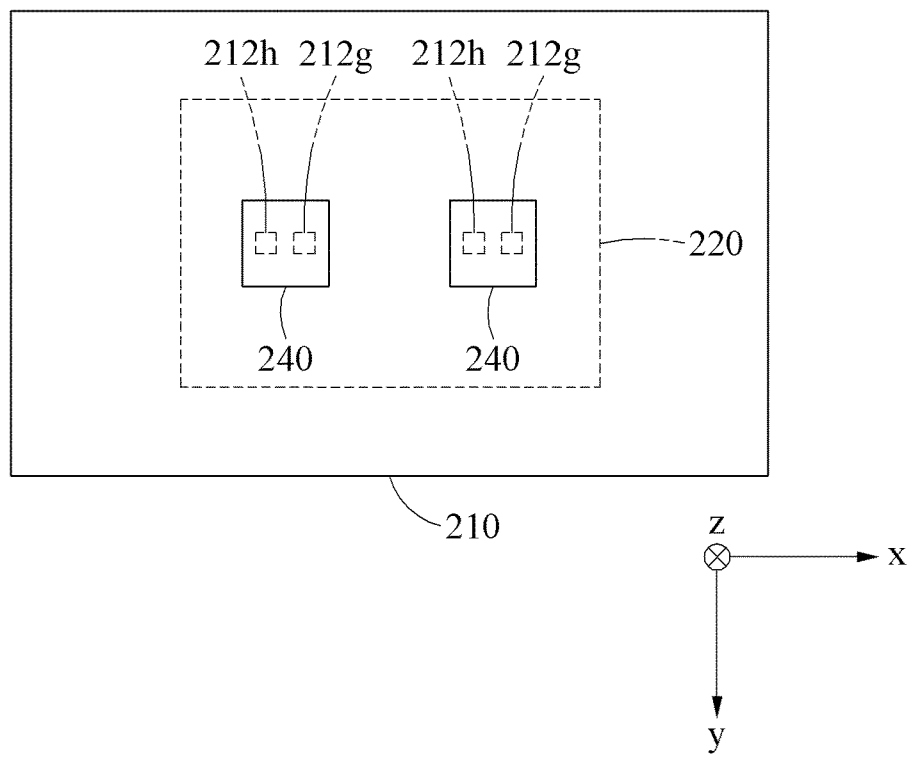
FIG. 2C is a bottom view of a package device according to an embodiment of the disclosure.
Figure 2D:
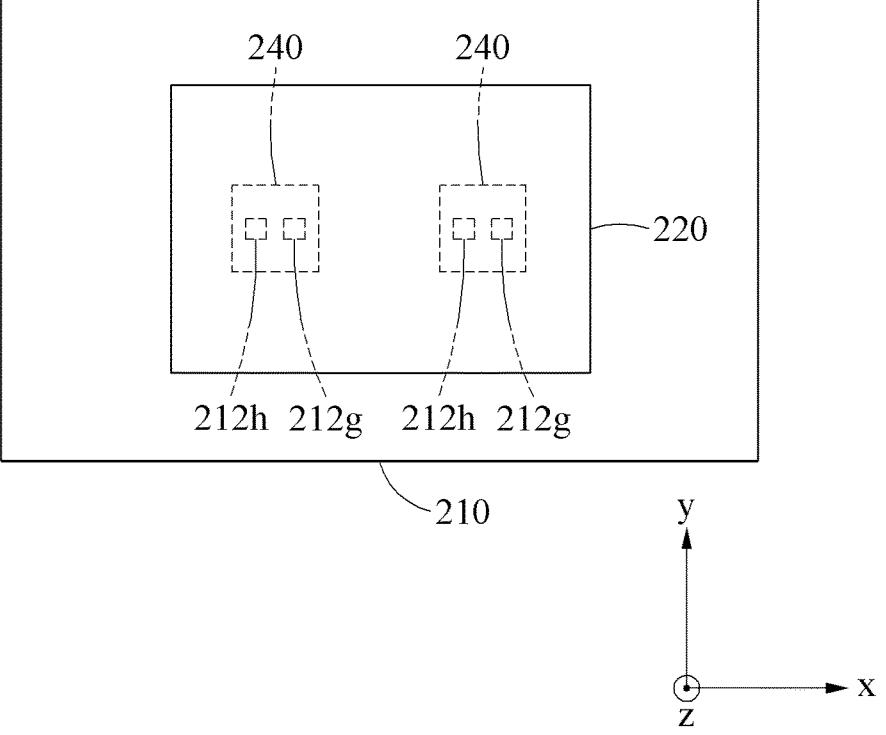
FIG. 2D is a plan view of a package device according to an embodiment of the disclosure.

FIG. 2A is a cross-sectional view of a package device according to an embodiment of the disclosure. FIG. 2B is an enlarged view of A of FIG. 2A according to an embodiment of the disclosure. FIG. 2C is a bottom view of a package device according to an embodiment of the disclosure. FIG. 2D is a plan view of a package device according to an embodiment of the disclosure.

Referring to FIGS. 2A, 2B, 2C, and 2D, a package device 200 comprising a capacitor provided at an opposite side of a die relative to a substrate (hereinafter, referred to as a "package device") may be an antenna module (e.g., the antenna module 197 of FIG. 1).

The package device 200 may include a substrate 210 on which at least one layer is stacked, a die 220 provided on the upper side (the +z direction) of the substrate 210, a capacitor 240 provided on the lower side (the −z direction) of the substrate 210, a plurality of upper lands 211 provided on the top surface of the substrate 210, a plurality of lower lands 212 provided on the bottom surface of the substrate 210, a resin mold 221 enclosing the die 220, an upper solder ball 231 for connecting the substrate 210 to the die 220, and a lower solder ball 232 for connecting the substrate 210 to a motherboard (not illustrated).

The substrate 210 may be a substrate including a plurality of circuits. For example, the substrate 210 may include a PCB and/or a printed wiring board (PWB). A wiring for connecting circuit components based on a designed circuit may be provided on the surface of the substrate 210 and/or inside the substrate 210. The wiring formed on the substrate 210 may be electrically connected to an antenna and/or other components (e.g., low dropout (LDO), direct current (DC)/DC) described below.

The substrate 210 may include a plurality of conductive layers (not illustrated) and a plurality of vias (not illustrated) installed therein. Each via may connect two conductive layers spaced apart in the height direction of the substrate 210 among the plurality of conductive layers.

The substrate 210 may be electrically connected to the die 220 through a grid array. The grid array may include, for example, a land grid array (LGA) and a ball grid array (BGA). Since the LGA is a method in which a chip electrode is disposed on one surface of the substrate 210 in the form of an array, lead inductance may be relatively small, and thus, the LGA may be suitable for a package device requiring high processing speed. The BGA may be a method of arranging a solder on one surface of the substrate 210 in the form of an array and may be suitable for a module requiring multiple pins. The BGA may include a plurality of solder balls 231 and 232. In the drawings, illustrated is that a BGA is adopted as a grid array. However, the example is not limited thereto. A top surface 210a of the substrate 210 may face the +z direction and a bottom surface 210b of the substrate 210 may face the −z direction.

To arrange the plurality of solder balls 231 and 232, the plurality of upper lands 211 and the plurality of lower lands 212 may be provided on surfaces of the substrate 210. The plurality of solder balls 231 and 232 may include a plurality of upper solder balls 231 connecting the substrate 210 to the die 220 and a plurality of lower solder balls 232 connecting the substrate 210 to the motherboard (not illustrated). The upper solder ball 231 and the lower solder ball 232 may be provided in different sizes or the same size.

The plurality of upper lands 211 may be disposed on one surface of the substrate 210. For example, the plurality of upper lands 211 may be provided on the top surface of the substrate 210 and may support the plurality of upper solder balls 231. The plurality of upper lands 211 may include a power upper land 211h and a ground upper land 211g. A power terminal and a ground terminal of the substrate 210 may be electrically connected to the power upper land 211h and the ground upper land 211g.

The plurality of lower lands 212 may be disposed on the other surface of the substrate 210. For example, the plurality of lower lands 212 may be provided on the bottom surface of the substrate 210 and may support the plurality of lower solder balls 232. The plurality of lower lands 212 may include a power lower land 212h and a ground lower land 212g. The power lower land 212h may be physically connected to one side of the capacitor 240 and may be electrically connected to the power upper land 211h through at least one via. The ground lower land 212g may be physically connected to the other side of the capacitor 240 and may be electrically connected to the ground upper land 211g through at least one via.

A portion of the substrate 210, where the plurality of upper lands 211 and the plurality of lower lands 212 are not provided, may be covered with an insulating layer (not illustrated).

The die 220 may be disposed on the upper side (the +z direction) of the substrate 210. The die 220 may include a radio frequency (RF) device. The die 220 may be connected to the plurality of upper solder balls 231 disposed on the plurality of upper lands 211 provided on the top surface 210a of the substrate 210. The die 220 may be physically and electrically connected to the substrate 210 through the upper solder ball 231. The die 220 may be molded by the resin mold 221.

The capacitor 240 may be provided on the lower side (the −z direction) of the substrate 210. An electrode of the capacitor 240 may be electrically connected to the power lower land 212h and the ground lower land 212g. For example, the capacitor 240 may have two electrodes, one of the two electrodes may be connected to the power lower land 212h, and the other one may be connected to the ground lower land 212g. For example, the electrode of the capacitor 240 may be connected to the lower land through the solder. A plurality of capacitors 240 may be provided. Although the drawing illustrates that two capacitors are provided, the number of capacitors is not limited thereto.

Because the capacitor 240 is disposed on the opposite side of the die 220 relative to the substrate 210, a relatively high noise reduction effect may be obtained. In addition, linearity may be improved in a wide band and undesired resonance may be removed. Specifically, such an arrangement of the capacitor 240 may improve the stability of power. As the capacitor 240 is disposed on the opposite side of the die 220, linearity of a transmitter may be improved and the linearity of the transmitter may be improved by suppressing a harmonic element of power in a baseband. The capacitor 240 may improve a bandwidth by removing an influence of parallel resonance by transmitting a parallel resonant frequency with an internal capacitance of the die 220 to a frequency that is higher than the baseband.

When the capacitor 240 is provided on the opposite side of the die 220 relative to the substrate 210, a loss due to internal resistance of the substrate 210 may be mitigated because a wiring connecting the die 220 to the capacitor 240 is shortened. When the package device 200 includes two or more types of power, the two or more types power may need to use different conductive layers, and this may lead to an increase in the number of conductive layers. On the other hand, when the capacitor 240 is provided on the opposite side of the die 220 relative to the substrate 210, the number of conductive layers of the substrate 210 may decrease and the substrate 210 may be compactly configured. By effectively connecting the power land of the die 220 to the capacitor 240, the performance of the capacitor 240 may increase, linearity may be improved in a wide band, and undesired resonance may be removed.

The upper solder ball 231 may be disposed on the plurality of upper lands 211. The upper solder ball 231 may connect the substrate 210 to the die 220. The upper solder ball 231 may be disposed between the die 220 and the top surface 210a of the substrate 210.

The lower solder ball 232 may connect the substrate 210 to the motherboard (not illustrated). A plurality of lower solder balls 232 may be provided and may be disposed on the lower land 212 to which the capacitor 240 is not connected among the plurality of lower lands 212.

The height of the capacitor 240 may be greater than the height of the lower solder ball 232. A height L1 of the lower solder ball 232 may be less than a height L2 of the capacitor 240. In this case, the "height" may be a length formed in the height direction of the substrate 210, in other words, in the z-axis direction. The capacitor 240 may be disposed at a position overlapping the die 220 based on the height direction of the substrate 210, in other words, the z-axis direction.

The power lower land 212h and the ground lower land 212g may be provided on the opposite side of the die 220 relative to the substrate 210. The power lower land 212h and the ground lower land 212g may be disposed at a position overlapping the die 220 based on the height direction of the substrate 210, in other words, the z-axis direction. According to the structure described above, the performance of the capacitor 240 may be improved by decreasing a connection path between the power upper land 211h and the ground upper land 211g and the power lower land 212h and the ground lower land 212g of the die 220. The linearity may be improved in a wide band and undesired resonance may be removed.

Based on the normal direction of the bottom surface 210b of the substrate 210, in other words, the −z direction, the maximum distance of the capacitor 240 from the bottom surface 210b of the substrate 210 may be greater than the maximum distance of the lower solder ball 232 from the bottom surface 210b of the substrate 210. For example, the maximum distance of the capacitor 240 from the bottom surface 210b of the substrate 210 may be a value obtained by adding the height of the capacitor 240 to the height of one of the power lower land 212h and the ground lower land 212g having a relatively greater height. The maximum distance of the lower solder ball 232 from the bottom surface 210b of the substrate 210 may be a value obtained by adding the height of the lower solder ball 232 to the height of the lower land 212. For example, the height of the power lower land 212h may be the same as the height of the ground lower land 212g, and the height of the lower solder ball 232 may be the same as the height of the power lower land 212h and/or the ground lower land 212g.

When the height L1 of the lower solder ball 232 is less than the height L2 of the capacitor 240 while implementing the substrate 210 to the motherboard (not illustrated), the capacitor 240 may interfere with the motherboard (not illustrated). To resolve such an interference, various embodiments are presented below with reference to FIGS. 3A and 3B.

Figure 3A:
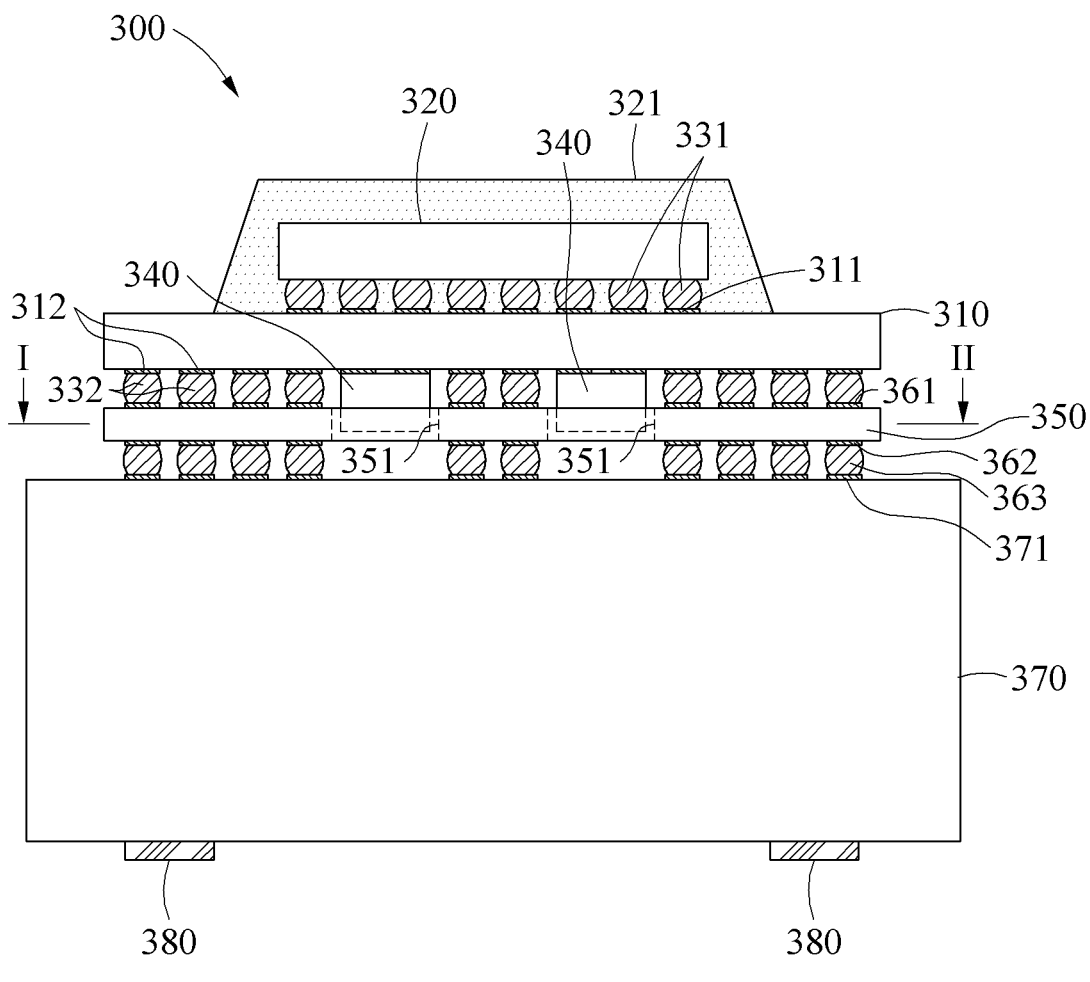
FIG. 3A is a cross-sectional view of a package device according to an embodiment of the disclosure.
Figure 3A:
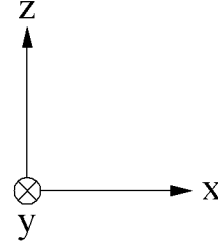
Figure 3B:
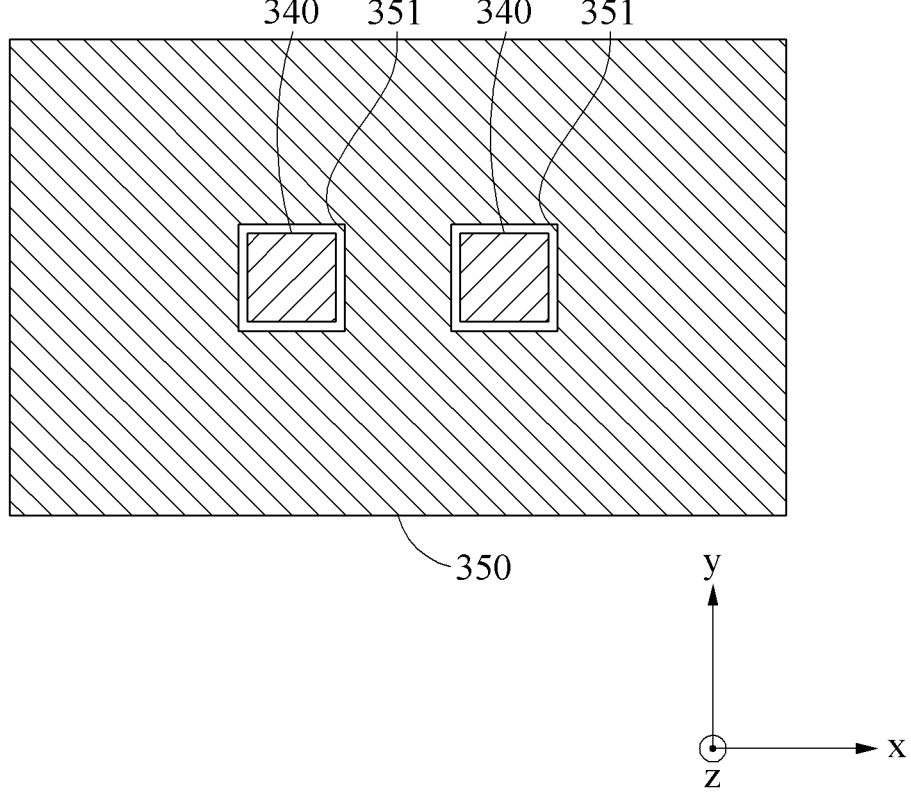
FIG. 3B is a cross-sectional view taken along a line I-II of FIG. 3A according to an embodiment of the disclosure.

FIG. 3A is a cross-sectional view of a package device according to an embodiment of the disclosure. FIG. 3B is a cross-sectional view taken along a line I-II of FIG. 3A according to an embodiment of the disclosure.

Referring to FIGS. 3A and 3B, a package device 300 may include a substrate 310 on which at least one layer is stacked, a die 320 provided on the upper side (the +z direction) of the substrate 310, a capacitor 340 provided on the lower side (the −z direction) of the substrate 310, an interposer 350 and a motherboard 370 provided on the lower side of the substrate 310, a plurality of upper lands 311 provided on the top surface of the substrate 310, a plurality of lower lands 312 provided on the bottom surface of the substrate 310, a resin mold 321 enclosing the die 320, an upper solder ball 331 for connecting the substrate 310 to the die 320, a lower solder ball 332 for connecting the substrate 310 to the interposer 350, a plurality of first interposer lands 361 provided on the top surface of the interposer 350, a plurality of second interposer lands 362 provided on the bottom surface of the interposer 350, a plurality of interposer solder balls 363 for connecting the interposer 350 to the motherboard 370, a plurality of board lands 371 provided on the top surface of the motherboard 370, and at least one antenna 380 connected to the motherboard 370.

The interposer 350 may be disposed between the substrate 310 and the motherboard 370. The plurality of first interposer lands 361 may be disposed on the top surface (a surface facing the +z direction) of the interposer 350, and the plurality of second interposer lands 362 may be disposed on the bottom surface (a surface facing the −z direction) of the interposer 350. The plurality of lower solder balls 332 may be disposed between the plurality of lower lands 212 and the plurality of first interposer lands 361. The plurality of interposer solder balls 363 may be disposed between the plurality of second interposer lands 362 and the plurality of board lands 371.

The interposer 350 may include a plurality of conductive layers (not illustrated) and a plurality of vias (not illustrated). Each of the plurality of vias may connect two conductive layers spaced apart in the height direction of the interposer 350 among the plurality of conductive layers.

The sum of the height of the interposer 350, the height of the lower solder ball 332, and the height of the plurality of interposer solder balls 363 may be greater than the height of the capacitor 340. According to the length relationship described above, even if the height of the capacitor 340 is greater than the height of the lower solder ball 332, interference of the capacitor 340 with the motherboard 370 may be prevented.

The interposer 350 may include an accommodating part 351 that accommodates at least a portion of the capacitor 340. For example, the accommodating part 351 may be formed at a position corresponding to the capacitor 340 and may be a hole or a groove accommodating at least a portion of the capacitor 340. Specifically, the accommodating part 351 may be a hole penetrating in the height direction of the interposer 350, in other words, the z-axis direction, or a groove recessed in the −z direction from the top surface of the interposer 350. In the drawings, the accommodating part 351 is illustrated as a hole but is not limited thereto. The accommodating part 351 may be formed to correspond to the number of capacitors 340.

The capacitor 340 may be provided on the opposite side of the die 320 relative to the substrate 310. The capacitor 340 may be spaced apart from the motherboard 370.

The motherboard 370 may face the bottom surface of the substrate 310. Between the substrate 310 and the motherboard 370, the lower solder ball 332, the interposer 350, and the plurality of interposer solder balls 363 may be sequentially disposed.

A plurality of antennas 280 (e.g., the antenna module 197 of FIG. 1) may be provided, and the plurality of antennas 280 may be disposed on one surface of the motherboard 370 and may be spaced apart from each other. The antenna may be a patch antenna.

Figure 4A:
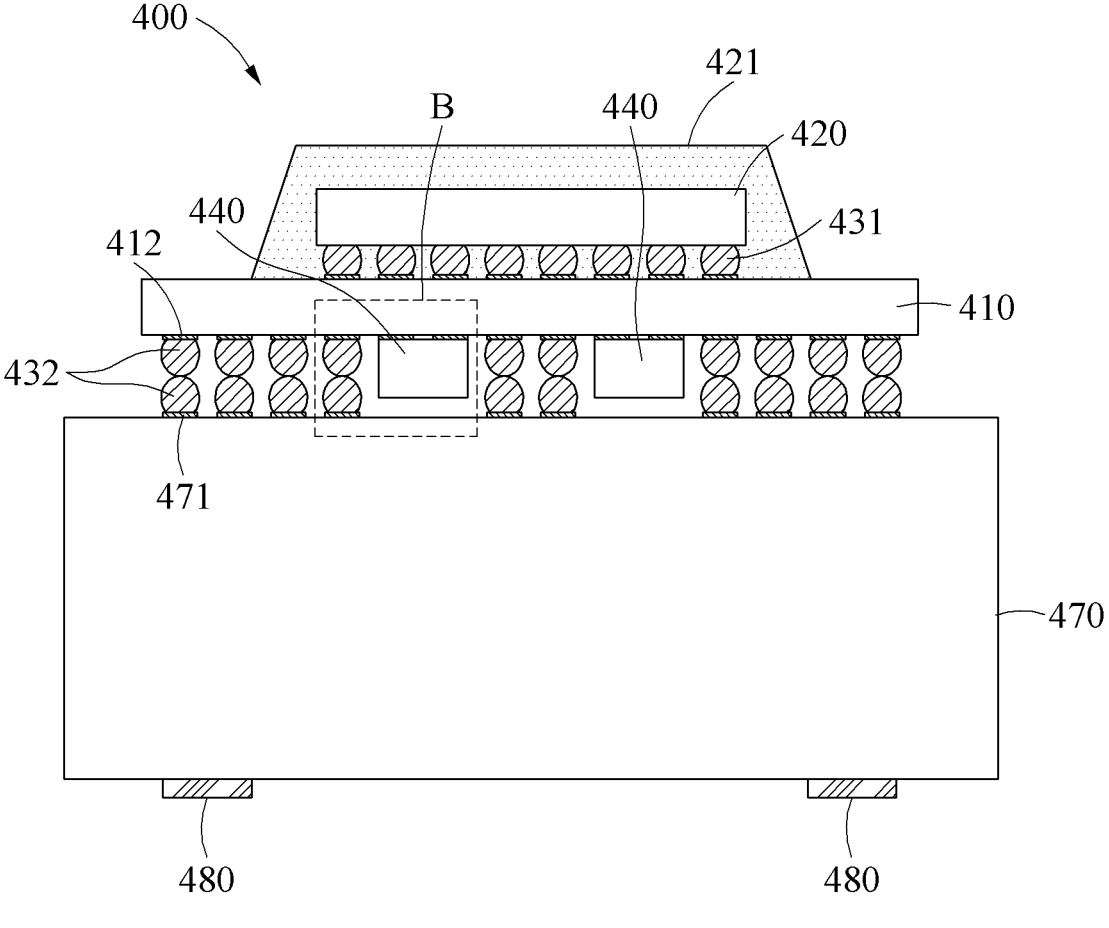
FIG. 4A is a cross-sectional view of a package device according to an embodiment of the disclosure.
Figure 4B:
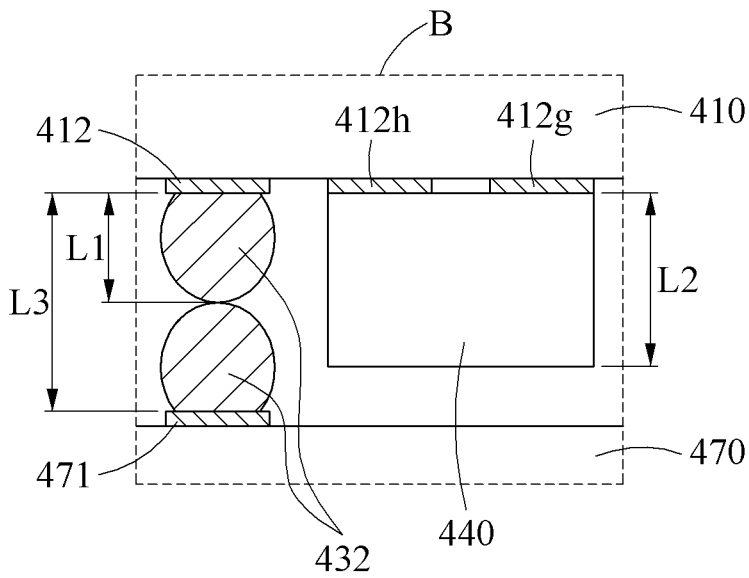
FIG. 4B is an enlarged view of B of FIG. 4A according to an embodiment of the disclosure.

FIG. 4A is a cross-sectional view of a package device according to an embodiment of the disclosure. FIG. 4B is an enlarged view of B of FIG. 4A according to an embodiment of the disclosure.

Referring to FIGS. 4A and 4B, a package device 400 may include a substrate 410 on which at least one layer is stacked, a die 420 provided on the upper side (the +z direction) of the substrate 410, a capacitor 440 provided on the lower side (the −z direction) of the substrate 410, a motherboard 470 provided on the lower side of the substrate 410, a plurality of lower lands 412 provided on the bottom surface of the substrate 410, a resin mold 421 enclosing the die 420, an upper solder ball 431 for connecting the substrate 410 to the die 420, a lower solder ball 432 for connecting the substrate 410 to the motherboard 470, a plurality of board lands 471 provided on the top surface of the motherboard 470, and at least one antenna 480 connected to the motherboard 470.

The plurality of lower lands 412 may be provided on the bottom surface of the substrate 410 and may support the plurality of lower solder balls 432. The plurality of lower lands 412 may include a power lower land 412h and a ground lower land 412g. The power lower land 412h may be physically connected to one side of the capacitor 440 and the ground lower land 412g may be physically connected to the other side of the capacitor 440.

The plurality of board lands 471 may be disposed on a surface of the motherboard 470 facing the bottom surface of the substrate 410. At least two lower solder balls 432 may be disposed side by side between one of the plurality of lower lands 412 and one of the board lands 471 facing the one lower land 412. In the drawings, two lower solder balls 432 are disposed side by side. However, the number of lower solder balls 432 is not limited thereto. For example, three or more lower solder balls 432 may be disposed side by side between the lower land 412 and the board land 471.

A height L1 of the lower solder ball 432 may be less than a height L2 of the capacitor 440. A total height L3 of the plurality of lower solder balls 432 may be greater than the height L2 of the capacitor 440. Because the total height L3 of the plurality of lower solder balls 432 is greater than the height L2 of the capacitor 440, the capacitor 440 may be spaced apart from the motherboard 470 and interference of the capacitor 440 with the motherboard 470 may be prevented.

A distance between the lower land 412 and the board land 471 may be the same as the total height L3 of the plurality of lower solder balls 432 and may be greater than the height L2 of the capacitor 440.

For example, during a reflow treatment, some of the plurality of lower solder balls 432 may be transformed and the total height L3 may slightly decrease. However, even after the reflow treatment is completely finished, the total height L3 of the plurality of lower solder balls 432 may be greater than the height L2 of the capacitor 440.

Figure 5A:
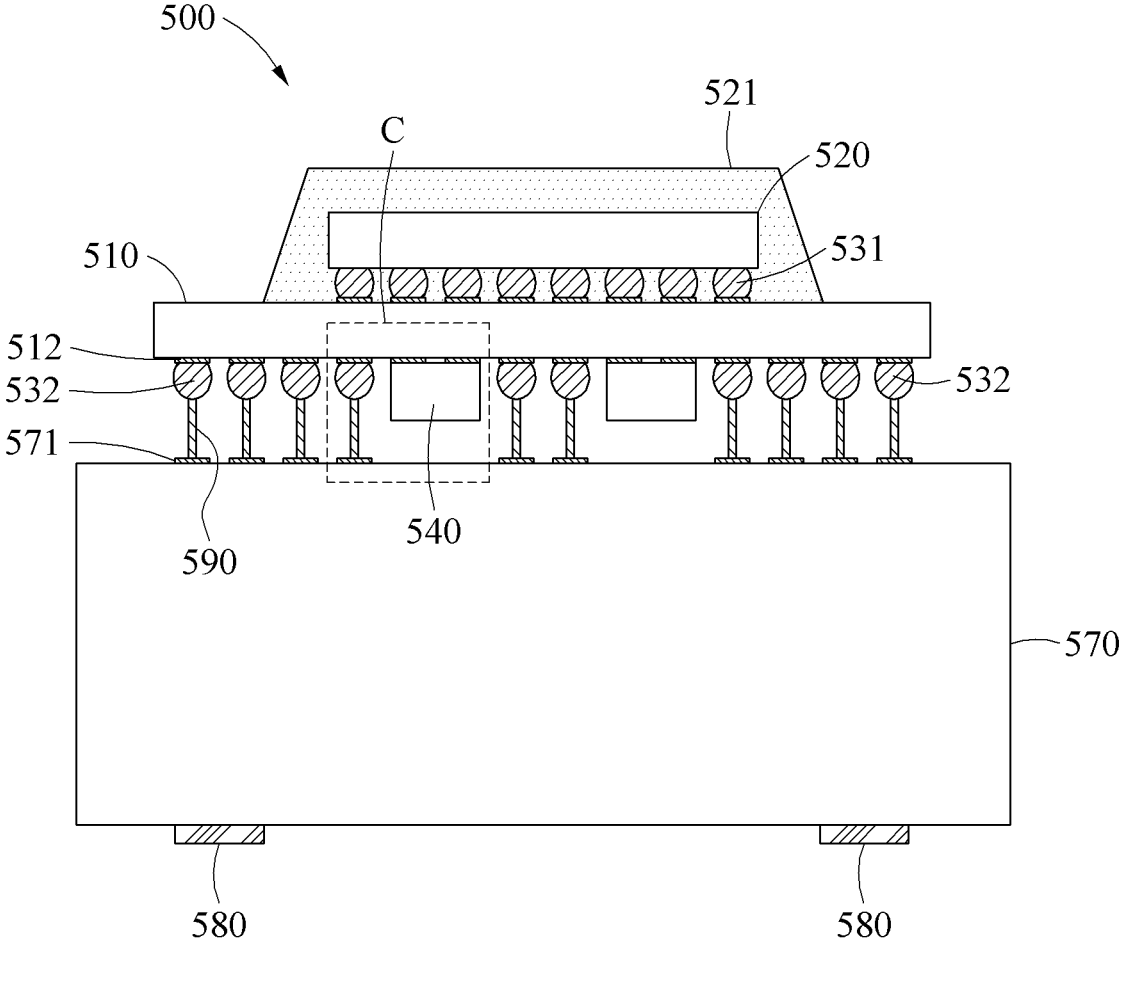
FIG. 5A is a cross-sectional view of a package device according to an embodiment of the disclosure.
Figure 5A:
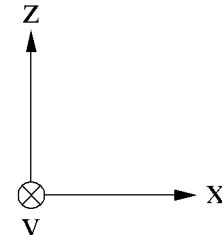
Figure 5B:
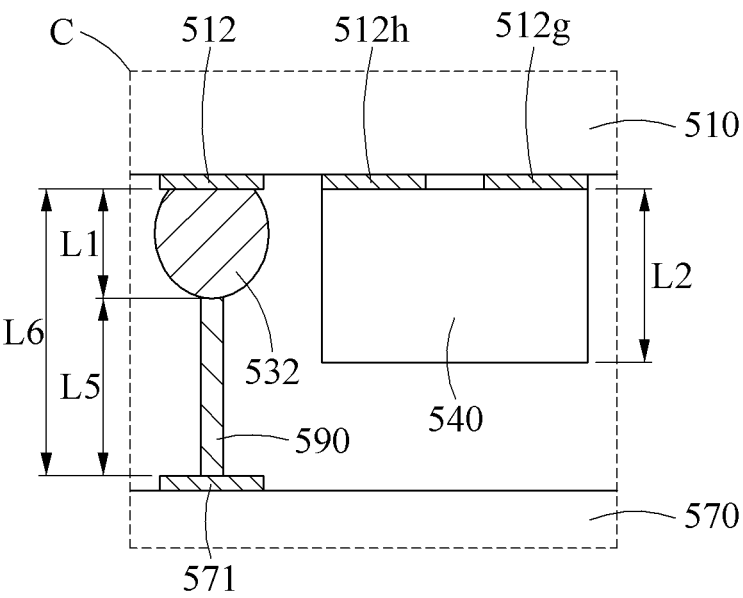
FIG. 5B is an enlarged view of C of FIG. 5A according to an embodiment of the disclosure.
Figure 5C:
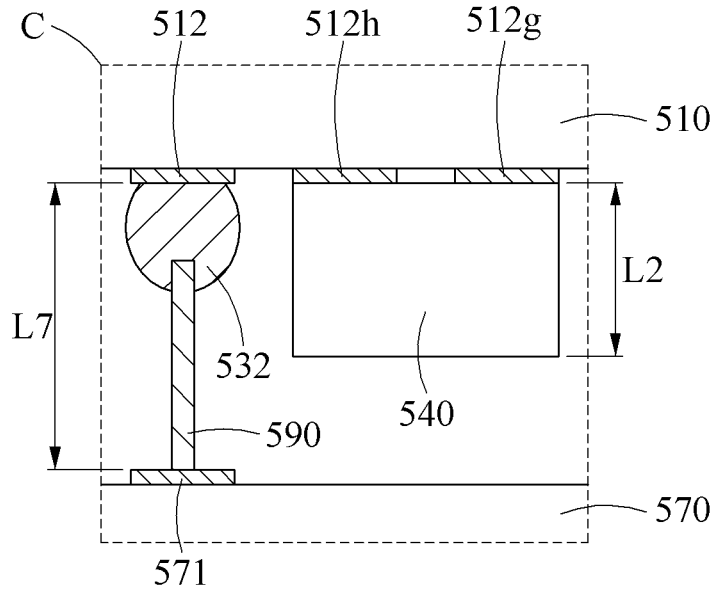
FIG. 5C is a diagram schematically illustrating a state in which a reflow treatment to the structure illustrated in FIG. 5B has been performed according to an embodiment of the disclosure.

FIG. 5A is a cross-sectional view of a package device according to an embodiment of the disclosure. FIG. 5B is an enlarged view of C of FIG. 5A according to an embodiment of the disclosure. FIG. 5C is a diagram schematically illustrating a state in which a reflow treatment to the structure illustrated in FIG. 5B has been performed according to an embodiment of the disclosure.

Referring to FIGS. 5A and 5B, a package device 500 may include a substrate 510 on which at least one layer is stacked, a die 520 provided on the upper side (the +z direction) of the substrate 510, a capacitor 540 provided on the lower side (the −z direction) of the substrate 510, a motherboard 570 provided on the lower side of the substrate 510, a plurality of lower lands 512 provided on the bottom surface of the substrate 510, a resin mold 521 enclosing the die 520, an upper solder ball 531 for connecting the substrate 510 to the die 520, a lower solder ball 532 and a connecting pin 590 for connecting the substrate 510 to the motherboard 570, a plurality of board lands 571 provided on the top surface of the motherboard 570, and at least one antenna 580 (e.g., the antenna module 197 of FIG. 1) connected to the motherboard 570.

The plurality of lower lands 512 may be provided on the bottom surface of the substrate 510 and may support the plurality of lower solder balls 532. The plurality of lower lands 512 may include a power lower land 512h and a ground lower land 512g. The power lower land 512h may be physically connected to one side of the capacitor 540 and the ground lower land 512g may be physically connected to the other side of the capacitor 540.

The plurality of board lands 571 may be disposed on a surface of the motherboard 570 facing the bottom surface of the substrate 510. The lower solder ball 532 and the connecting pin 590 may be disposed side by side between one of the plurality of lower lands 512 and one of the plurality of board lands 571 facing the one lower land 512. In the drawings, illustrated is that the lower solder ball 532 is connected to the lower land 512 and the connecting pin 590 is connected to the plurality of board lands 571. However, the order is not limited thereto. For example, the connecting pin 590 may be connected to the lower land 512 and the lower solder ball 532 may be connected to the plurality of board lands 571.

In addition, the number of lower solder balls 532 and the number of connecting pins 590 are not limited to embodiments illustrated in the drawings. For example, two or more lower solder balls 532 and/or two or more connecting pins 590 may be provided.

The connecting pin 590 may be, for example, a metal pin and may physically and electrically connect the lower solder ball 532 to the plurality of board lands 571.

A height L1 of the lower solder ball 532 may be less than a height L2 of the capacitor 540. A total height L6, which is the sum of the height L1 of the lower solder ball 532 and a height L5 of the connecting pin 590, may be greater than the height L2 of the capacitor 540. Because the total height L6 of the lower solder ball 532 and the connecting pin 590 is greater than the height L2 of the capacitor 540, the capacitor 540 may be spaced apart from the motherboard 570 and interference of the capacitor 540 with the motherboard 570 may be prevented.

A distance between the lower land 512 and the plurality of board lands 571 may be the same as the total height L6 of the lower solder ball 532 and the connecting pin 590 and may be greater than the height L2 of the capacitor 540.

For example, during a reflow treatment, some of a plurality of lower solder balls 532 may be transformed and may flow along the upper end of the connecting pin 590. However, even after the reflow treatment is completely finished, a total height L7 of the lower solder ball 532 and the connecting pin 590 may be greater than the height of the capacitor 440.

Figure 6A:
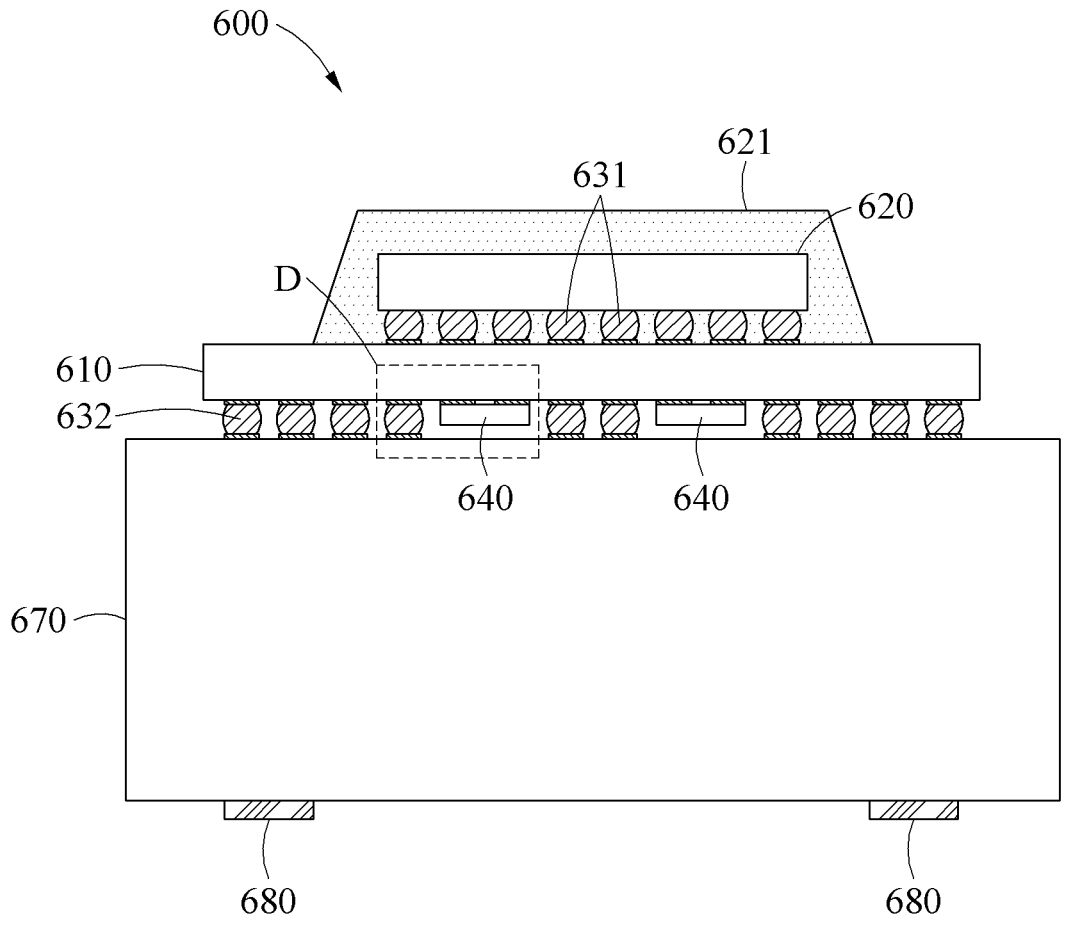
FIG. 6A is a cross-sectional view of a package device according to an embodiment of the disclosure.
Figure 6A:
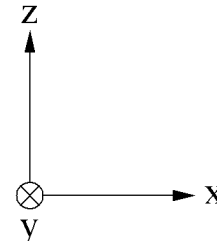
Figure 6B:
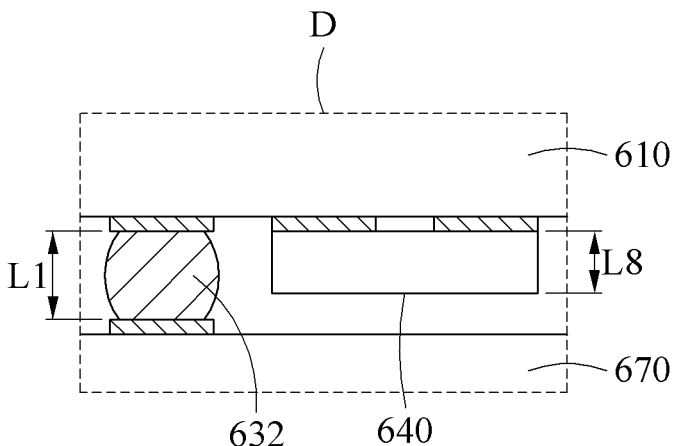
FIG. 6B is an enlarged view of D of FIG. 6A according to an embodiment of the disclosure.

FIG. 6A is a cross-sectional view of a package device according to an embodiment of the disclosure. FIG. 6B is an enlarged view of D of FIG. 6A according to an embodiment of the disclosure.

Referring to FIGS. 6A and 6B, a package device 600 may include a substrate 610 on which at least one layer is stacked, a die 620 provided on the upper side (the +z direction) of the substrate 610, a capacitor 640 provided on the lower side (the −z direction) of the substrate 610, a motherboard 670 provided on the lower side of the substrate 610, a resin mold 621 enclosing the die 620, a plurality of upper solder balls 631 for connecting the substrate 610 to the die 620, a plurality of lower solder balls 632 for connecting the substrate 610 to the motherboard 670, and at least one antenna 680 (e.g., the antenna module 197 of FIG. 1) connected to the motherboard 670.

The motherboard 670 may include a plurality of conductive layers (not illustrated) and a plurality of vias (not illustrated) installed therein. Each via may connect two conductive layers spaced apart in the height direction of the substrate 210 among the plurality of conductive layers. The motherboard 670 may include a first RF power line constituted by at least one conductive layer and at least one via and a second RF power line constituted by at least one other conductive layer and at least one other via. Some of the plurality of vias may electrically connect one of the plurality of lower solder balls 632 to one antenna 680 (e.g., the antenna module 197 of FIG. 1). Some of the plurality of vias may electrically connect another one of the plurality of lower solder balls 632 to another antenna 680 (e.g., the antenna module 197 of FIG. 1).

The capacitor 640 may be provided on the opposite side of the die 620 relative to the substrate 610 and a height L8 of the capacitor 640 may be less than a height L1 of the plurality of lower solder balls 632. As the capacitor 640 is provided on the opposite side of the die 620, power may be stabilized and linearity of an antenna may be improved. Specifically, such an arrangement of the capacitor 640 may improve the linearity of the antenna by suppressing a harmonic element in a baseband.

Figure 7:
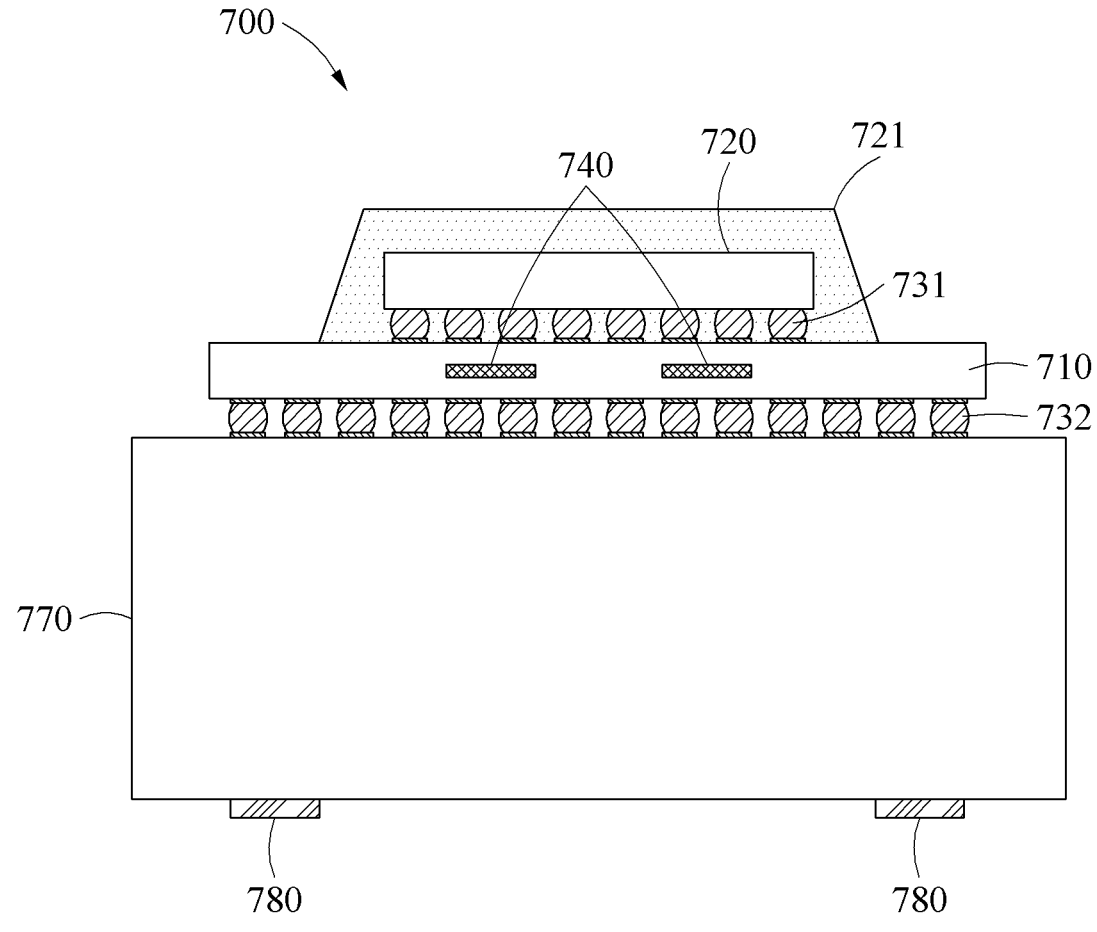
FIG. 7 is a cross-sectional view of a package device according to an embodiment of the disclosure.
Figure 7:
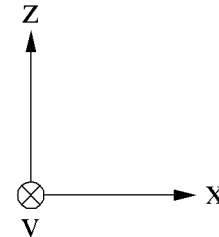

FIG. 7 is a cross-sectional view of a package device according to an embodiment of the disclosure.

Referring to FIG. 7, a package device 700 may include a substrate 710 on which a plurality of layers is stacked, a die 720 provided on the upper side (the +z direction) of the substrate 710, a capacitor 740 provided inside the substrate 710, a motherboard 770 provided on the lower side of the substrate 710, a resin mold 721 enclosing the die 720, an upper solder ball 731 for connecting the substrate 710 to the die 720, a lower solder ball 732 for connecting the substrate 710 to the motherboard 770, and at least one antenna 780 (e.g., the antenna module 197 of FIG. 1) connected to the motherboard 770. For example, the capacitor 740 may be disposed between two adjacent layers among the plurality of layers. The capacitor 740 may be provided on the opposite side of the die 720 relative to the top surface of the substrate 710.

Figure 8:
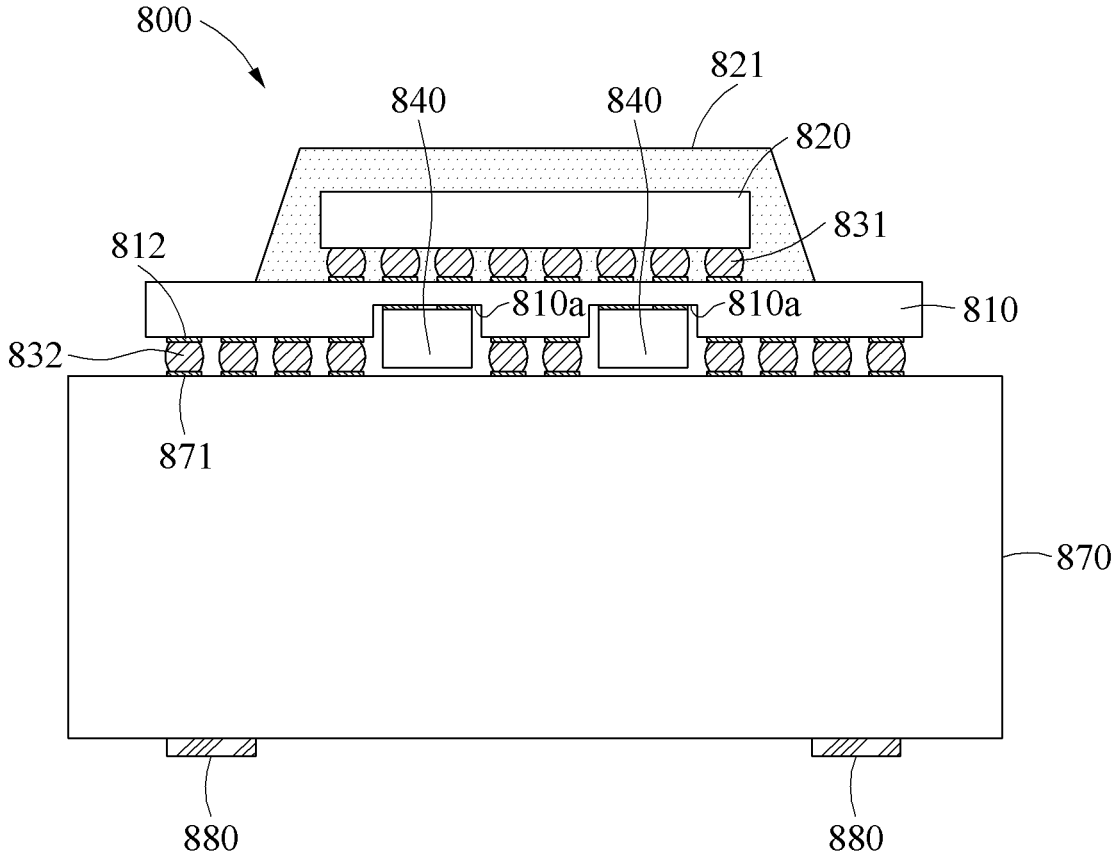
FIG. 8 is a cross-sectional view of a package device according to an embodiment of the disclosure.

FIG. 8 is a cross-sectional view of a package device according to an embodiment of the disclosure.

Referring to FIG. 8, a package device 800 may include a substrate 810 on which at least one layer is stacked, a die 820 provided on the upper side (the +z direction) of the substrate 810, a capacitor 840 provided on the lower side (the −z direction) of the substrate 810, a motherboard 870 provided on the lower side of the substrate 810, a plurality of lower lands 812 provided on the bottom surface of the substrate 810, a resin mold 821 enclosing the die 820, an upper solder ball 831 for connecting the substrate 810 to the die 820, a lower solder ball 832 for connecting the substrate 810 to the motherboard 870, a plurality of board lands 871 provided on the top surface of the motherboard 870, and at least one antenna 880 connected to the motherboard 870.

The substrate 810 may include a substrate groove 810*a* upwardly recessed from the bottom surface of the substrate 810. In other words, the substrate 810 may include the substrate groove 810*a* formed in a surface of the substrate 810 facing the motherboard 870. The substrate groove 810*a* may accommodate at least a portion of the capacitor 840. On the bottom surface of the substrate groove 810, the lower land 412 connected to the capacitor 840 may be disposed. Since an upper end portion of the capacitor 840 is accommodated in the substrate groove 810*a*, although the height of the lower solder ball 832 is less than the height of the capacitor 840, the capacitor 440 may be spaced apart from the motherboard 470 and interference of the capacitor 440 with the motherboard 470 may be prevented. Although illustrated is that one capacitor 440 is accommodated in one substrate groove 810*a*, the number of capacitors 440 is not limited thereto. For example, two or more capacitors 440 may be accommodated in one substrate groove 810*a*.

According to an embodiment of the disclosure, the package device 300 including a capacitor disposed on an opposite side of a die relative to a substrate (hereinafter, referred to as the package device) may include A package device including a capacitor disposed on an opposite side of a die relative to a substrate, the package device may include a substrate 310, a plurality of upper lands 311 disposed on one surface of the substrate 310, a plurality of upper solder balls 331 disposed on the plurality of upper lands 311, a die 320 connected to the plurality of upper solder balls 331, a plurality of lower lands 312 disposed on the other surface of the substrate 310, a plurality of lower solder balls 332 disposed on some of the plurality of lower lands 312, and a capacitor 340 connected to the lower lands on which lower solder balls are not disposed among the plurality of lower lands 312, provided on an opposite side of the die 320, and including a height greater than the height of the lower solder ball 332.

The capacitor 340 may be disposed at a position overlapping the die 320 based on a height direction of the substrate 310.

Based on a normal direction of the other surface of the substrate 310, a maximum distance of the capacitor 340 from the other surface of the substrate 310 may be greater than a maximum distance of the lower solder ball 332 from the other surface of the substrate 310.

The plurality of upper lands 211 may include a power upper land 211*h* and a ground upper land 211*g*, and the plurality of lower lands 212 may include a power lower land 212*h* electrically connected to the power upper land 211*h* and physically connected to one side of the capacitor 240 and a ground lower land 212*g* electrically connected to the ground upper land 211*g* and physically connected to the other side of the capacitor 240.

The power lower land 212*h* and the ground lower land 212*g* may be provided on the opposite side of the die 220 relative to the substrate 210.

The power lower land 212*h* and the ground lower land 212*g* may be disposed at a position overlapping the die 220 based on a height direction of the substrate 210.

The package device 300 may further include the motherboard 370 facing the other surface of the substrate 310, and at least one antenna 380 connected to the motherboard 370.

The capacitor 340 may be spaced apart from the motherboard 370.

The package device may further include an interposer 350 disposed between the substrate 310 and the motherboard 370 and connected to the plurality of lower solder balls 332, and a plurality of interposer solder balls 363 connecting the interposer 350 to the motherboard 370.

The interposer 350 may include an accommodating part 351 accommodating at least a portion of the capacitor 340.

The package device may further include a plurality of board lands 471 disposed on a surface of the motherboard 470 facing the other surface of the substrate 410, wherein at least two lower solder balls 432 may be disposed side by side between one of the plurality of lower lands 412 and one board land 471 facing the one of the plurality of lower lands 412.

A distance L3 between the one of the plurality of lower lands 412 and the one board land 471 may be greater than a height L2 of the capacitor 440.

The package device may further include the plurality of board lands 571 disposed on a surface of the motherboard 570 facing the other surface of the substrate 510, and the connecting pin 590 connected to the lower solder ball 532 and disposed between one of the plurality of lower lands 512 and one of the plurality of board lands 571 facing the one of the plurality of lower lands 512.

A sum L6 of a height L1 of the lower solder ball 532 and a height L5 of the connecting pin 590 may be greater than a height L2 of the capacitor 520.

The substrate may include a substrate groove recessed in the other surface of the substrate, and at least a portion of the capacitor may be accommodated in the substrate groove.

The package device 300 in an embodiment may include the motherboard 370, at least one antenna 380 connected to the motherboard 370, a substrate 310 including a bottom surface facing the motherboard 370 and a top surface that is an opposite surface of the bottom surface, a plurality of upper lands 311 disposed on the top surface of the substrate 310, a plurality of upper solder balls 331 disposed on the plurality of upper lands 311, a die 320 connected to the plurality of upper solder balls 331, a plurality of lower lands 312 disposed on the bottom surface of the substrate 310, a plurality of lower solder balls 332 disposed on some of the plurality of lower lands 312, and a capacitor 340 connected to the lower lands on which the lower solder balls are not disposed among the plurality of lower lands 312, provided on an opposite side of the die 320, and including a height greater than the height of the lower solder ball 332, and wherein the capacitor 340 may be disposed at a position overlapping the die 320 based on a height direction of the substrate 310.

The package device may further include an interposer 350 disposed between the substrate 30 and the motherboard 370 and connected to the plurality of lower solder balls 332, and a plurality of interposer solder balls 363 connecting the interposer 350 to the motherboard 370.

The package device may further include a plurality of board lands 471 disposed on a surface of the motherboard 470 facing the other surface of the substrate 410, wherein at least two lower solder balls 432 may be disposed side by side between one of the plurality of lower lands 412 and one board land 471 facing the one of the plurality of lower lands 412.

The package device may further include the plurality of board lands 571 disposed on a surface of the motherboard 570 facing the other surface of the substrate 510, and the connecting pin 590 disposed between a lower solder ball 532 disposed on one of the plurality of lower lands 512 and the plurality of board lands 571 facing the one of the plurality of lower lands 512.

The package device 600 in an embodiment may include a motherboard 670, at least one antenna 680 connected to the motherboard 670, a substrate 610 including a bottom surface facing the motherboard 670 and a top surface that is an opposite surface of the bottom surface, the plurality of upper solder balls 631 disposed on the top surface of the substrate, a die 620 connected to the plurality of upper solder balls 631, the plurality of lower solder balls 632 disposed on the bottom surface of the substrate 610, and a capacitor 640 connected to the substrate 610 and disposed at a position overlapping the die 620 based on a height direction of the substrate 610.

The capacitor 740 may be disposed inside the substrate 710.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A package device comprising:
a substrate;
a plurality of upper lands disposed on one surface of the substrate;
a plurality of upper solder balls disposed on the plurality of upper lands;
a die connected to the plurality of upper solder balls;
a plurality of lower lands disposed on another surface of the substrate;
a plurality of lower solder balls disposed on some of the plurality of lower lands;
a capacitor connected to the lower lands on which the plurality of lower solder balls are not disposed among the plurality of lower lands, provided on an opposite side of the die, and comprising a height greater than the height of the plurality of lower solder balls;
a motherboard facing the other surface of the substrate; and
at least one antenna connected to the motherboard,
wherein the capacitor is spaced apart from the motherboard.

2. The package device of claim 1, wherein the capacitor is disposed at a position overlapping the die based on a height direction of the substrate.

3. The package device of claim 1, wherein based on a normal direction of the other surface of the substrate, a maximum distance of the capacitor from the other surface of the substrate is greater than a maximum distance of the plurality of lower solder balls from the other surface of the substrate.

4. The package device of claim 1,
wherein the plurality of upper lands comprises a power upper land and a ground upper land, and
wherein the plurality of lower lands comprises:
a power lower land electrically connected to the power upper land and physically connected to one side of the capacitor, and
a ground lower land electrically connected to the ground upper land and physically connected to another side of the capacitor.

5. The package device of claim 4, wherein the power lower land and the ground lower land are provided on the opposite side of the die relative to the substrate.

6. The package device of claim 5, wherein the power lower land and the ground lower land are disposed at a position overlapping the die based on a height direction of the substrate.

7. The package device of claim 1, further comprising:
an interposer comprising an accommodating part accommodating at least a portion of the capacitor, disposed on the opposite side of the die relative to the substrate, disposed between the substrate and the motherboard, and connected to the plurality of lower solder balls; and
a plurality of interposer solder balls connecting the interposer to the motherboard.

8. The package device of claim 1, further comprising:

a plurality of board lands disposed on a surface of the motherboard facing the other surface of the substrate, wherein at least two lower solder balls are disposed side by side between one of the plurality of lower lands and one board land facing the one of the plurality of lower lands.

9. The package device of claim 8, wherein a distance between the one of the plurality of lower lands and the one board land is greater than a height of the capacitor.

10. The package device of claim 1, further comprising:

a plurality of board lands disposed on a surface of the motherboard facing the other surface of the substrate; and a connecting pin connected to the plurality of lower solder balls and disposed between one of the plurality of lower lands and one board land facing the one of the plurality of lower lands.

11. The package device of claim 10, wherein a sum of a height of the plurality of lower solder balls and a height of the connecting pin is greater than a height of the capacitor.

12. The package device of claim 1, wherein the substrate comprises a substrate groove recessed in the other surface of the substrate, and wherein at least a portion of the capacitor is accommodated in the substrate groove.

13. A package device comprising:

a motherboard;

at least one antenna connected to the motherboard;

a substrate comprising a bottom surface facing the motherboard and a top surface that is an opposite surface of the bottom surface;

a plurality of upper lands disposed on the top surface of the substrate;

a plurality of upper solder balls disposed on the plurality of upper lands;

a die connected to the plurality of upper solder balls;

a plurality of lower lands disposed on the bottom surface of the substrate;

a plurality of lower solder balls disposed on some of the plurality of lower lands;

a capacitor connected to the lower lands on which the plurality of lower solder balls are not disposed among the plurality of lower lands, provided on an opposite side of the die, and comprising a height greater than the height of the plurality of lower solder balls;

an interposer disposed between the substrate and the motherboard and connected to the plurality of lower solder balls; and a plurality of interposer solder balls connecting the interposer to the motherboard, wherein the capacitor is disposed at a position overlapping the die based on a height direction of the substrate.

14. The package device of claim 13, further comprising:

a plurality of board lands disposed on a surface of the motherboard facing the other surface of the substrate, wherein at least two lower solder balls are disposed side by side between one of the plurality of lower lands and one board land facing the one of the plurality of lower lands.

15. A package device comprising:

a motherboard;

at least one antenna connected to the motherboard;

a substrate comprising a bottom surface facing the motherboard and a top surface that is an opposite surface of the bottom surface;

a plurality of upper lands disposed on the top surface of the substrate;

a plurality of upper solder balls disposed on the plurality of upper lands;

a die connected to the plurality of upper solder balls;

a plurality of lower lands disposed on the bottom surface of the substrate;

a plurality of lower solder balls disposed on some of the plurality of lower lands;

a capacitor connected to the lower lands on which the plurality of lower solder balls are not disposed among the plurality of lower lands, provided on an opposite side of the die, and comprising a height greater than the height of the plurality of lower solder balls;

a plurality of board lands disposed on a surface of the motherboard facing the other surface of the substrate; and a connecting pin disposed between a lower solder ball disposed on one of the plurality of lower lands and a board land facing the one of the plurality of lower lands, wherein the capacitor is disposed at a position overlapping the die based on a height direction of the substrate.

* * * * *